United States Patent [19]

Roos

[11] Patent Number: 4,647,847

[45] Date of Patent: Mar. 3, 1987

[54] METHOD AND APPARATUS FOR ELIMINATING HARMONIC SKIP

[75] Inventor: Mark D. Roos, San Carlos, Calif.

[73] Assignee: Hewlett-Packard Company, Palo Alto, Calif.

[21] Appl. No.: 569,008

[22] Filed: Jan. 9, 1984

[51] Int. Cl.$^4$ ............................................. G01R 23/14
[52] U.S. Cl. .................................. 324/79 R; 324/83 D
[58] Field of Search ................ 324/79 R, 79 D, 83 D; 455/226, 164, 147

[56] References Cited

U.S. PATENT DOCUMENTS

| | | | |
|---|---|---|---|
| 3,714,580 | 1/1973 | Close | 455/164 |
| 3,984,770 | 10/1976 | Chu | 324/83 D |
| 4,063,169 | 12/1977 | Palmer | 324/79 D |
| 4,135,243 | 1/1979 | Peregrino | 324/79 D |
| 4,345,206 | 8/1982 | Skalka | 324/79 R |

Primary Examiner—Michael J. Tokar
Attorney, Agent, or Firm—Edward Y. Wong; Paul L. Hickman

[57] ABSTRACT

A method is provided to eliminate harmonic skip problems in a down-conversion system. The method makes use of the relationship between the frequency of the intermediate frequency signal and the harmonic number of the local oscillator signal with respect to the frequency of the frequency of the source signal. By monitoring and measuring corresponding changes in the intermediate frequency signal caused by predetermined changes in the frequency of the local oscillator signal, a determination of the proper local oscillator signal and the proper harmonic can be made using a processor. The proper frequency and harmonic can then be maintained by periodically checking the relationship between variables.

7 Claims, 1 Drawing Figure

METHOD AND APPARATUS FOR ELIMINATING HARMONIC SKIP

BACKGROUND AND SUMMARY OF THE INVENTION

In measurement systems using harmonic down conversion to reduce a radio frequency (RF) source signal to a lower, and hence more tractable, intermediate frequency (IF) signal for measurement purposes, a major source of measurement error is harmonic skip. Harmonic skip occurs when different harmonics of the local oscillator signal which is used to convert the radio frequency signal to the intermediate frequency signal are used each time in arriving at the intermediate frequency signal. And when harmonic skip occurs, the measured intermediate frequency signal fluctuates in amplitude and phase in an unpredictable manner.

In the prior art, several approaches are used to counter this harmonic skip problem. One approach is to require the operator to "tune" the source signal. Another approach is to require the operator to tune the local oscillator. Both approaches, as is evident, necessitates input from the operator to stabilize the signals for the least amount of harmonic skipping and are workable only for continuous wave (CW) signals. When a swept signal is used, as in must systems, these techniques become approximations.

In accordance with the present invention, harmonic skipping is eliminated in a down-conversion system without requiring input from the operator. In accordance with the preferred embodiment of the invention, a pretune controller varies and sets a local oscillator signal to the proper frequency for mixing with and down converting the radio frequency source signal to a predetermined intermediate frequency signal. In the down conversion, a predetermined harmonic number of the local oscillator signal is used. A predetermined harmonic of the source signal may also be used; in such cases, the source signal frequency is varied by a controller.

In the case of a predetermined harmonic of the local oscillator, the pretune control setting is verified as the proper one by requiring the local oscillator to change in frequency by a predetermined step. The corresponding change in the intermediate frequency signal should be the same as the product of the predetermined harmonic number and the step change. In other words, IF Change = (Harmonic Number) × (Step Change).

If the harmonic number inadvertently differs from the predetermined one, the corresponding intermediate frequency signal change will then differ from the product. In such an event, the pretune control is made to vary, for example, by a microprocessor, until the intermediate frequency signal is again produced, thus enacting a "searching" process. The local oscillator is again made to change in frequency by a predetermined step, the corresponding intermediate frequency signal change is measured, and a comparison of this change to the product is again made. This process is repeated until the corresponding change is equal to the product of the step change and the harmonic number. When this happens, the proper local oscillator frequency is achieved and the predetermined harmonic of the local oscillation is used in the down conversion. No harmonic skipping is occurring to invalidate measurements.

DETAILED DESCRIPTION OF THE INVENTION

Figure 1:
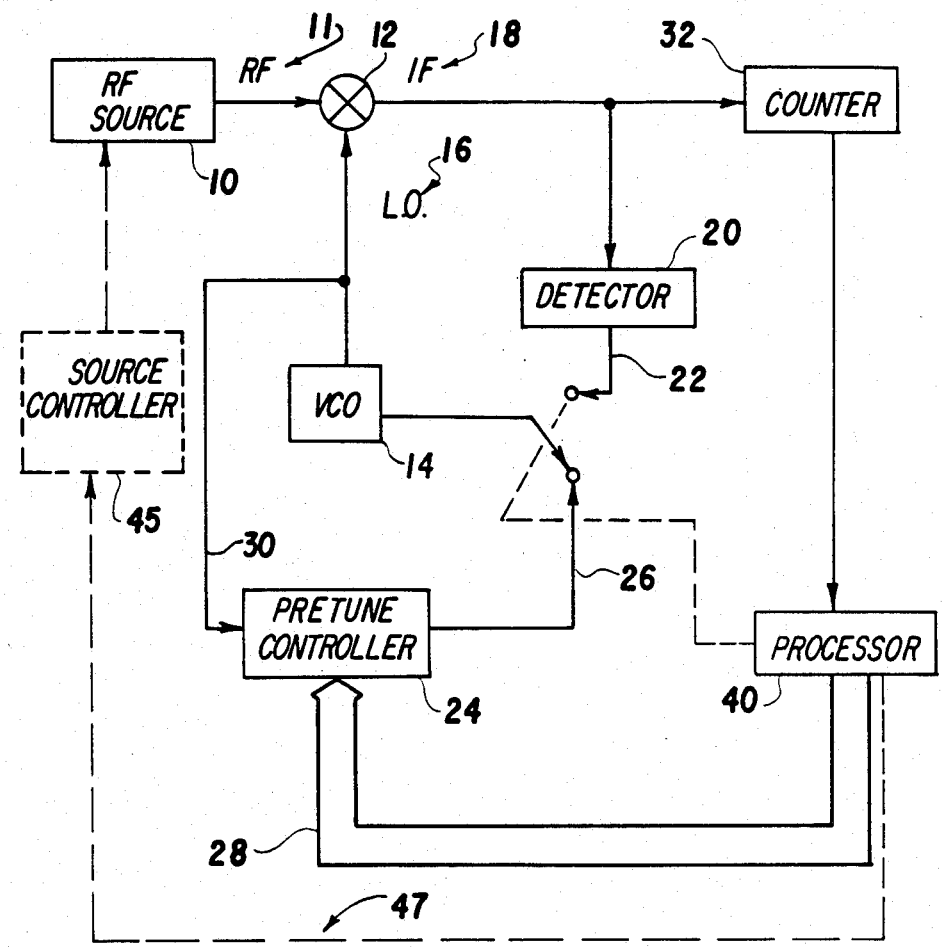
FIG. 1 is a block diagram of a preferred embodiment of the invention.

As depicted in FIG. 1, an RF signal 11 from an RF source 10 is coupled into a harmonic mixer 12, where it is multiplied together with a local oscillator (L.O.) signal 16 from a variable local oscillator 14, typically a voltage-controlled oscillator (VCO). The output from the mixer 12 is an IF signal 18. A pretune controller 24 varies the local oscillator 14 until a predetermined IF signal is produced. Since the predetermined IF signal can be the product of the RF signal and an undesired harmonic of a L.O. signal, a means for determining whether the L.O. signal is the proper one and that the predetermined harmonic number of the L.O. signal is being used in the conversion is necessary to avoid the errors caused by harmonic skipping. In accordance with the invention, the pretune controller 24 causes the L.O. 14 to change in frequency by a predetermined amount in response from an input 28 thereto. The corresponding change in the IF signal is measured by a frequency-sensitive device, typically a counter 32. This change is compared with the product of the predetermined harmonic number of the L.O. signal and the step change in a processor 40, for example, a microprocessor. If the product and the corresponding change are not equal, the L.O. signal is improper and an undesired harmonic of the L.O. signal is being used. The processor 40 causes the pretune controller 24 to vary the L.O. frequency further until the IF signal 18 is again produced. The L.O. 14 is again made to change frequency by a predetermined amount. Another comparison of the corresponding IF signal change is made. And the process is repeated until the corresponding IF signal change is equal to the calculated and expected change, viz., the product of the predetermined harmonic number and the step change. When the equality occurs, it has been determined that the L.O. 14 is at the proper frequency and the proper harmonic is being used in the down conversion.

Once the proper L.O. frequency and the proper harmonic are being used, the processor 40 switches control of the L.O. 14 from the pretune controller 24 to the output 22 of a phase-locking detector 20 having the IF signal 18 as its input. The detector 40 forms a closed loop system with the L.O. 14 and IF signal to track variations of the RF source signal, such as when the source signal is being swept.

In other embodiments, the RF and L.O. signals 10, 16 may be interchanged. In other words, instead of varying the L.O. signal to ensure that the proper frequency and harmonic are being used to obtain the predetermined IF signal, the RF source signal is varied instead and the L.O. signal is made to have a predetermined frequency.

Correction of the RF source signal frequency can be made using and expanding the principles of the invention. Since the harmonic number of the L.O. signal is predetermined and the frequency of the IF signal is measured, the frequency of the source signal can be calculated in accordance with the following relationship:

Source Frequency = (Harmonic Number) × (L.O. Frequency) + IF Frequency.

Thus, following this relationship, a controller 45 for adjusting the source frequency is coupled to the frequency source 10 in the system depicted in FIG. 1. A calculation is made in the processor 40 and a correction signal 47 from the processor 40 is applied to the adjusting means to vary the frequency of the RF source 10 until the RF source frequency 11 is correct. In this way, a close loop is formed to monitor the RF signal and to maintain it at the correct frequency constantly.

I claim:

1. A method for eliminating harmonic skip in a down-conversion system by providing a desired intermediate frequency signal from the mixture of a source signal and a particular harmonic of a local oscillator signal comprising the steps of:
   a. mixing a source signal with a local oscillator signal including a fundamental signal and a plurality of harmonic signals to produce a plurality of intermediate frequency signals;
   b. varying the frequency of said fundamental signal until a desired intermediate frequency signal is produced among said plurality of intermediate frequency signals;
   c. changing the frequency of said fundamental signal by a predetermined step amount;
   d. measuring the corresponding change in said desired intermediate frequency signal;
   e. comparing said corresponding change with the product of a particular harmonic number and said predetermined step amount; and
   f. repeating steps b. through e. until the product and the corresponding change are substantially equal.

2. An apparatus for eliminating harmonic skip in a down-conversion system by providing a desired intermediate frequency signal from the mixture of a source signal and a particular harmonic of a local oscillator signal, said apparatus comprising:
   a mixer for producing a plurality of intermediate frequency signals from a combination of a source signal and a local oscillator signal having a fundamental frequency and a plurality of harmonics of said fundamental frequency;
   a counting means coupled to said mixer for measuring a desired intermediate frequency signal of said plurality of intermediate frequency signals;
   a variable oscillator coupled to said mixer for producing said local oscillator signal;
   a processing means coupled to said counting means for producing a control signal in response to the measurement of said desired intermediate frequency signal by said counting means; and
   a pretune controller coupled to said variable oscillator and said processing means for varying said fundamental frequency of said variable oscillator in response to said control signal.

3. The apparatus as in claim 2 further comprising a source means for providing said source signal.

4. The apparatus as in claim 2 further comprising:
   a detector means responsive to said intermediate frequency signal and operative to supply a tracking signal; and
   switch means for alternately coupling said pretune controller and said detector means to said variable oscillator to alternately supply said local oscillator with said control signal and said tracking signal, respectively.

5. A method for adjusting the frequency of a source signal in a down-conversion system which mixes said source signal with a local oscillator signal having a fundamental frequency and a plurality of harmonic frequencies to develop a plurality of intermediate frequency signals including a desired intermediate frequency signal corresponding to a particular harmonic number of said fundamental frequency of said local oscillator signal, comprising the steps of:
   determining the harmonic number of said desired intermediate signal;
   measuring the frequency of said desired intermediate signal;
   summing the measured frequency of said desired intermediate frequency signal and the product of said harmonic number and said fundamental frequency of said local oscillator frequency; and
   adjusting the frequency of the source signal in response to said summing step.

6. The apparatus as in claim 3, further comprising:
   a source controller coupled to the source means for varying the frequency of the source signal in response to a second control signal;
   wherein said processing means further produces said second control signal in response to said measured intermediate frequency signal.

7. The method as in claim 5, wherein said step of determining the harmonic number of said desired intermediate frequency signal comprises:
   varying the frequency of said fundamental signal until a desired intermediate frequency signal is produced among said plurality of intermediate frequency signals;
   changing the frequency of said fundamental signal by a predetermined step amount;
   measuring the corresponding change in said desired intermediate frequency signal; and
   comparing said corresponding change with the product of a particular harmonic number and said predetermined step amount.

* * * * *